(12) United States Patent
Rivoir

(10) Patent No.: US 7,248,660 B2
(45) Date of Patent: Jul. 24, 2007

(54) TRANSITION TRACKING

(75) Inventor: Jochen Rivoir, Magstadt (DE)

(73) Assignee: Verigy (Singapore) PTE, Ltd., Singapore (SG)

( * ) Notice: Subject to any disclaimer, the term of this patent is extended or adjusted under 35 U.S.C. 154(b) by 685 days.

(21) Appl. No.: 10/642,781

(22) Filed: Aug. 18, 2003

(65) Prior Publication Data

US 2005/0025274 A1    Feb. 3, 2005

(30) Foreign Application Priority Data

Feb. 25, 2003    (EP) .................................. 03100454

(51) Int. Cl.
*H04L 7/00* (2006.01)
(52) U.S. Cl. ...................... 375/355; 375/340
(58) Field of Classification Search ................ 375/340, 375/355
See application file for complete search history.

(56) References Cited

U.S. PATENT DOCUMENTS

| | | | |
|---|---|---|---|
| 5,295,155 A | 3/1994 | Gersbach et al. ............... 375/4 |
| 5,400,370 A | 3/1995 | Guo ........................... 375/118 |
| 5,453,995 A | 9/1995 | Behrens ........................ 371/27 |
| 5,499,248 A | 3/1996 | Behrens et al. ............. 371/22.1 |
| 2002/0188888 A1 | 12/2002 | Rivoir ........................ 714/25 |

FOREIGN PATENT DOCUMENTS

| | | |
|---|---|---|
| EP | 859318 | 8/1998 |
| EP | 864977 | 9/1998 |
| EP | 882991 | 12/1998 |
| EP | 886214 | 12/1998 |
| EP | 1092983 | 4/2001 |

OTHER PUBLICATIONS

"All-digital Synchronizers For DPSK Demodulators", Jamadagni et al., Conference Article, 1990, pp. 268-283.

*Primary Examiner*—Kevin Kim

(57) ABSTRACT

A method for tracking transitions in a bit stream of a signal includes taking a first sample of said bit stream at a first sampling point of a first sampling sequence, taking a second sample of said bit stream at a second sampling point of said first sampling sequence, and taking a third sample of said bit stream at a third sampling point of said first sampling sequence, wherein said second sampling point is adjusted so that within a first time period, defined by said first and said second sampling points, the number of transitions in said bit stream is equal to the number of transitions within a second time period, defined by said second and said third sampling points.

17 Claims, 2 Drawing Sheets

TRANSITION TRACKING

BACKGROUND OF THE INVENTION

The present invention relates to the tracking of transitions within a bit stream, in particular for tracking of transitions within a bit stream of an output signal of an electronic device to be tested.

Integrated Circuits (IC) generally need to be tested to assure proper operation. This—in particular—is required during IC development and manufacturing. In the latter case, the ICs are usually tested before final application. During test, the IC, as device under test (DUT), is exposed to various types of stimulus signals, and its responses are measured, processed and usually compared to an expected response of a good device. Automated test equipments (ATE) usually perform these tasks according to a device-specific test program. Examples for ATE are the Agilent 83000 and 93000 families of Semiconductor Test Systems of Agilent Technologies. Details of those families are also disclosed e.g. in EP-A-859318, EP-A-864977, EP-A-886214, EP-A-882991, EP-A-1092983, U.S. Pat. Nos. 5,499,248, 5,453,995

The output signals of modern integrated electronic circuits often exhibit non-deterministic clock latencies between activities even if they are stimulated with the same stimuli. During production test of those devices, prior art test equipment does a timing test by strobing the bit stream with a fixed timing. In the presence of a timing drift, this test will fail, even though the DUT is operating correctly.

The reasons for non-deterministic output timing are beyond others process variations causing unknown but static timing variations, temperature variations of the clock insertion delays causing unknown and time varying timing drift.

SUMMARY OF THE INVENTION

It is an object of the invention to improve testing of electronic devices. The object is solved as defined by the independent claims. Preferred embodiments are defined by the dependent claims.

Occurrence of transitions are detected by comparing the bit values at first, second, and third sampling points, namely the first, second, and third samples taken of said bit stream during the same sampling period which usually corresponds to one clock of said bit stream.

In a preferred embodiment, second sampling point is adjusted jointly with first and third sampling point by the same value, and where applicable also with the fourth sampling point at which a bit value can be extracted. First and second time periods can be selected according to the specification of the bit stream, e.g. according to the electronic device under test producing the bit stream. In many cases, first and second time periods are equal and/or fixed. According to the specification of the bit stream, there should be no transition between the third sampling point of a given sampling sequence and the first sampling point of a subsequent sampling sequence.

According to the present invention, the second sampling point is adjusted to be as near as possible to the time in point where transitions occurred previously and thus as near as possible to the time in point where the next transition has to be expected. Thus, sampling points are adjustable to allow full timing testing on all edges at programmable times without the need to know the expected bit stream. All sampling points are preferably derived from a master clock signal having preferably the same frequency as the bit stream.

The second sampling point can be adjusted at any time after a predetermined number of clocks or transitions of said bit stream. The transitions in the first and second time period can be counted, respectively, and the second sampling point is adjusted so that the numbers are equal or almost equal. If the counted numbers are already equal or less than a given limit, no adjustment is necessary.

The predetermined number of clocks to be observed before adjustment of the second sampling point can be large, e.g. between 10 and 1000, or low down to 1; in the latter case any transition occurring would result in an adjustment of the second sampling point.

In many cases it may be advantageous to evaluate continuously the transitions occurred. In other cases it may be advantageous to evaluate transitions only in regular or random intervals. If transitions are evaluated in intervals, the second sampling point can be adjusted at any transition occurred, or only after a predetermined number of clocks or transitions, as described above.

A sampling sequence comprises at least three sampling points in order to allow timing test or to allow bit extraction in case when timing drift is tolerated but no timing error is assumed. Preferably, a sampling sequence has the duration of a bit length of the bit stream.

By determining the number of transitions in the bit stream between a sampling point of a given sampling sequence and a sampling point of a sampling sequence following said given sampling sequence timing errors can be detected, in particular, a timing error exists if said number of transitions between said sampling points differs from zero. In particular between the third sampling point of a given sampling sequence and the first sampling point of a subsequent sampling sequence there should be no transition.

Bit extraction can use first or third sampling points being near or on the border of the time region within a sampling sequence where transitions are to be expected according to the specification of said bit stream, e.g. according to the specified jitter. The extracted bits are arranged to an extracted bit stream which can be stored and/or compared with an expected bit stream for testing purposes of an electronic device (DUT) under test providing said bit stream being a response on a predetermined input signal supplied to said electronic device.

A fourth sampling point can be used in order to provide detection of timing error as well as robust bit extraction even in case of tolerated timing drift. In the latter case, a bit error is distinguishable from a timing error. Preferably the fourth timing point follows the second timing point in about half of a bit length of said bit stream.

If transition tracking is recorded, for example by counting the transitions between first, second and third sampling points and by recording the adjustment of the delay, information about the drift spectrum can be extracted.

A preferred embodiment of the present invention allows robust bit-level test even in the presence of drift, jitter and/or non-deterministic start delay, as well as idle packet suppression and/or random start up suppression if transition adjustment is provided.

BRIEF DESCRIPTION OF THE DRAWINGS

Other objects and many of the attendant advantages of the present invention will be readily appreciated and become better understood by reference to the following detailed

MORE DETAILED DESCRIPTION OF PREFERRED EMBODIMENTS ACCORDING TO THE INVENTION

Figure 1:
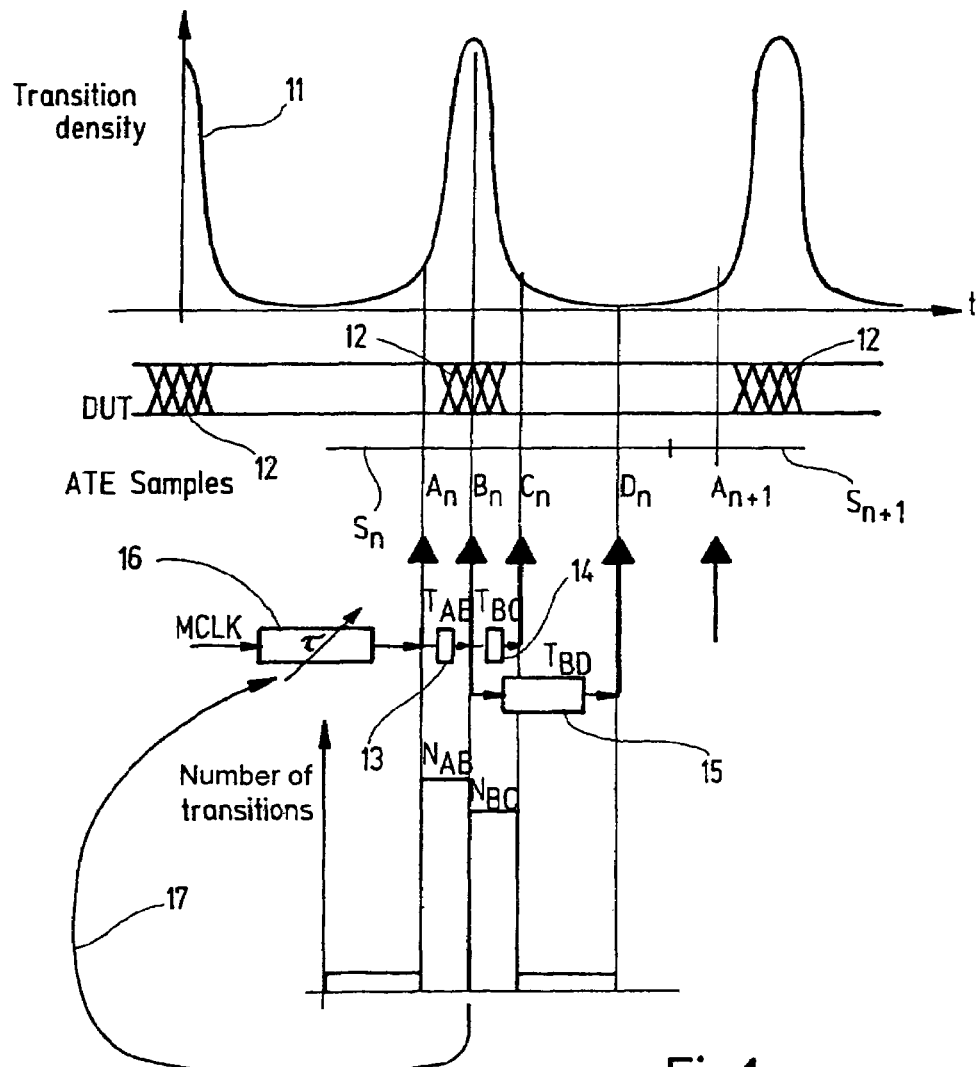
FIG. 1 shows a schematic view on the concept of the present invention.

FIG. 1 shows a schematic view on the concept of the present invention. The graph 11 represents the transition density of the bit stream 10 of the output signal of an electronic device under test (DUT). Below the graph 11, regions 12 are marked by cross hatching in which transitions are to be expected in the bit stream 10. The automatic test equipment (ATE) takes first An, second Bn, third Cn, and fourth Dn samples at corresponding first tAn, second tBn, third tCn, and fourth tDn sampling points of a first sampling sequence Sn.

The delay time TAB between first sampling point An and second sampling point Bn is provided by a first delay unit 13. Correspondingly, the delay time TBC between the second sampling point Bn and the third sampling point Cn is provided by a second delay unit 14, and the delay time TBD between the second sampling point Bn and the fourth sampling point Dn is provided by a third delay unit 15.

Transitions between the first sampling point An and the second sampling point Bn are counted as number NAB of transitions. Correspondingly, transitions between the second sampling point Bn and the third sampling point Cn are counted as number NBC of transitions.

A fourth delay unit 16 provides an adjustable delay time τ for the first sampling point An. In view of the preferably fixed delay time TAB between first sampling point An and second sampling Bn, the fourth delay unit 16 also adjusts the second sampling point Bn. All sampling points An, Bn, Cn, Dn of the first sampling sequence Sn are thus derived from the master clock signal MCLK having the same frequency as the bit stream 10 provided from the electronic device DUT.

According to the present invention, the delay time τ is adjusted so that the number NAB of transitions between the first sampling point An and the second sampling point Bn is equal to the number of transitions NBC between the second sampling point Bn and the third sampling point Cn. Such adjustment is provided automatically and represented in FIG. 1 by arrow 17. The variable delay time τ can also be frozen. Drift tracking is for example possible up to a drift of 10 ps/100 bits.

For timing test it has to be verified that the bit value at the third sampling point Cn of a first sampling sequence Sn is identical to the bit value at the first sampling point An+1 of a sampling sequence Sn+1 subsequent to said first sampling sequence Sn. If Cn is not equal to An+1, a timing error exists.

In other words, the number of transitions between the third sampling point Cn of a first sampling sequence Sn and the first sampling point An+1 of a subsequent sampling sequence Sn+1 should be zero.

If timing drift is tolerated, but no timing error is assumed, bits of the bit stream 10 can be extracted uniformly as first samples An, An+1, . . . of succeeding sampling sequences Sn, Sn+1, . . . , or uniformly as third samples Cn, Cn+1, . . . of succeeding sampling sequences Sn, Sn+1, . . . .

If timing drift is tolerated, but timing errors have to be detected, bits are extracted uniformly at fourth samples Dn, Dn+1, . . . of succeeding sampling sequences Sn, Sn+1, . . . . Said fourth sampling point Dn is located respectively between said third sample Cn of a first sampling sequence Sn and said first sample An+1 of a sampling sequence Sn subsequent to said first sampling sequence Sn. In particular, the delay time TBD provided by said third delay unit 15 is about half of a bit length of said bit stream 10.

Figure 2:
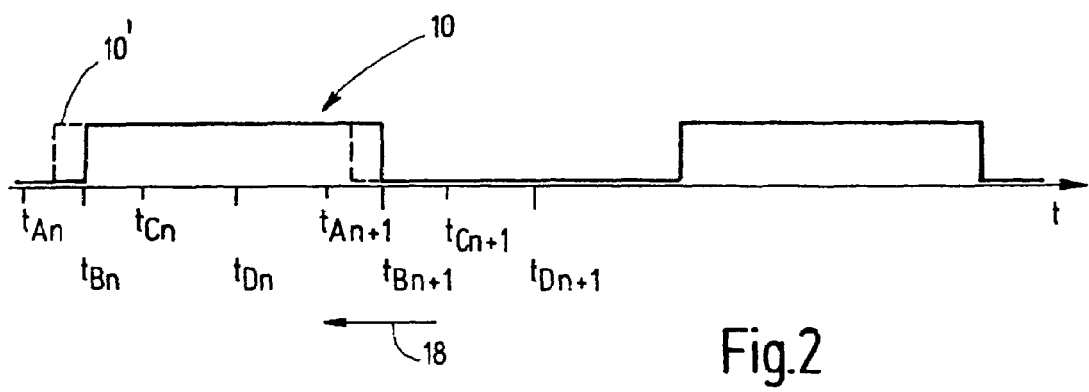
FIG. 2 shows a graph of the bit stream versus time.

FIG. 2 shows a graph of the bit stream 10 versus time t. The bit stream 10 represents a bit sequence 1-0-1 and shows first sampling point tAn, second sampling point tBn, and third sampling point tCn. The bit values are extracted at fourth sampling points tDn, tDn+1, etc. Assuming a transition drift as represented by the broken line 10' results in a shift of the second sampling point tBn+1 as represented by arrow 18. The time between first sampling point tAn and third sampling point tCn is defined by the specified jitter of the bit stream 10 according to the specification of the electronic device DUT to be tested.

Figure 3:
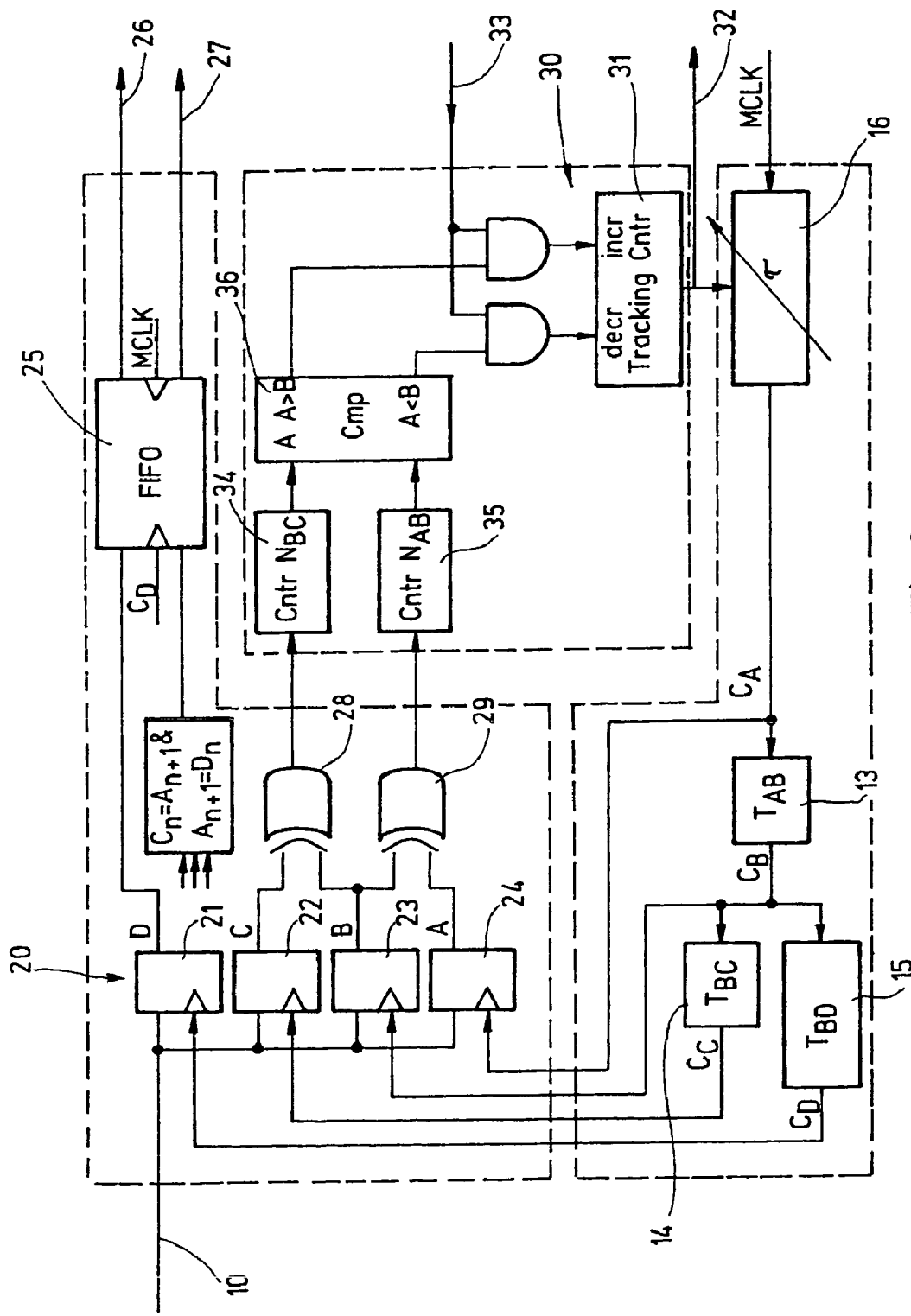
FIG. 3 shows a block diagram of a system for tracking transitions according to the present invention.

FIG. 3 shows a block diagram of a system for tracking transitions according to the present invention. The bit stream 10 of the electronic device under test DUT is inputted into four flip-flops 21, 22, 23, 24 being part of a sampling unit 20. The flip-flops 21, 22, 23, 24 receive as a further input signal respective clocks CA, CB, CC, CD derived from the master clock signal MCLK as described below. The four flip-flops 21, 22, 23, 24 are provided to take samples from the bit stream 10 at different sampling points tA, tB, tC, tD.

The output D of the first flipflop 21 is inputted in a FIFO memory 25. On a second input channel, FIFO memory 25 receives information concerning the timing of the bit stream 10, i.e. the result of a test whether the bit value of the third sample Cn of a given sample sequence is equal to the bit value of the first sample An+1 of a following sample sequence Sn+1, and whether the bit value of the first sample An+1 of a following sample sequence Sn+1 is equal to the bit value of the fourth sample Dn of the given sample sequence. Both input signals to the FIFO memory 25 are provided with the clock CD derived from the master clock signal MCLK as described below. The output of the FIFO memory 25 is provided synchronous to the master clock signal MCLK. The output is the extracted bit stream 26 and a signal 27 containing the information whether a timing error has been detected or not.

The master clock signal MCLK is delayed by the variable and adjustable fourth delay unit 16 by a delay time τ resulting in a clock signal CA for the fourth flip-flop 24. The clock signal CA is further delayed by the first delay unit 13 by a value TAB resulting in a clock signal CB for the third flip-flop 23. The clock signal CB is further delayed by the second delay unit 14 by a value TBC resulting in a clock signal CC for the second flip-flop 22. Furthermore, the clock signal CB is delayed by the third delay unit 15 by a value TBD resulting in the clock signal CD for the first flip-flop 21.

The outputs C, B of second and third flip-flop 22, 23 are inputted to a first EXOR element 28. The output of the first EXOR element 28 is signaling a transition between the second and the third sampling point tB, tC. The outputs B, A of the third and fourth flip-flop 23, 24 are inputted to a second EXOR element 29. The output of the second EXOR element 29 is signaling a transition between the first and the second sampling point tA and tB.

The sampling unit 20 is arranged in a clock domain running at bit rate. The first to fourth delay units 13, 14, 15, 16 are arranged in a clock domain tracking automatic test equipment ATE clocks at bit rate.

It is possible to connect directly the output of first and second EXOR elements 28, 29 to increment/decrement input of a tracking counter 31, respectively. The tracking counter 31 is arranged in an adjusting unit 30 and the output of the tracking counter 31 controls and adjust the fourth delay unit 16 and in particular varies the delay time τ in order to adjust the sampling points tA, tB, tC, tD. The output 32 of tracking counter 31 can be used to extract information about the drift spectrum. Furthermore, the input increment/decrement of the tracking counter 31 can be enabled/locked by a corresponding input signal 33, for example in order to lock the tracking counter 31 and to freeze delay time τ. If delay time τ is frozen, the bit stream 10 can be evaluated whether comprising any transition drift by detecting a timing error.

As shown in the embodiment of FIG. 3, the adjusting unit 30 can provide a kind of low-pass-filter characteristic. If—as described above—the outputs of the first and second EXOR elements 28, 29 are directly connected to the increment/decrement input of tracking counter 31, at any transition of the bit stream 10 tracking counter 31 varies the delay time τ due to a corresponding increment or decrement signal. Although this is not necessarily a problem, in some applications it is preferred to provide first and second counter 34, 35 to observe a predefined number of bits, e.g. between 10 and 1000, before readjusting delay time τ. For this purpose, a comparator 36 compares the number of transitions NAB between the first sampling point tA and the second sampling point tB with the number of transitions NBC between the second sampling point tB and the third sampling point tC. If NAB is greater than NBC, then the comparator 36 outputs a signal to decrement delay time τ. If, on the other hand, NBC is greater than NAB, then the comparator 36 outputs a signal to increment delay time τ. Providing such a low pass filter characteristic to the adjusting unit 30 has the advantage that the decision for increment or decrement the delay time τ can be made at lower clock speed, e.g. with a 500 MHz clock.

What is claimed is:

1. A method for tracking transitions in a bit stream of a signal, said method comprising the steps of:
    taking a first sample of said bit stream at a first sampling point of a first sampling sequence,
    taking a second sample of said bit stream at a second sampling point of said first sampling sequence, and
    taking a third sample of said bit stream at a third sampling point of said first sampling sequence,
    evaluating occurrence of at least one transition within at least one of a first and a second time period, wherein the first time period is defined by said first and said second sampling points, and the second time period is defined by said second and said third sampling points,
    adjusting said second sampling point to be near to the point in time where transition occurred, and
    tracking transitions in the bit stream by comparing bit values of the first, second, and third samples of the bit stream.

2. The method of claim 1, wherein said second sampling point is adjusted to an earlier point in time, if transition or majority of transitions occurred in said first time period.

3. The method of claim 1, wherein said second sampling point is adjusted to a later point in time, if transition or majority of transitions occurred in said second time period.

4. The method of claim 1, wherein said second sampling point is adjusted regularly after a predetermined number of clocks or transitions of said bit stream.

5. The method of claim 1, wherein said transitions occurred are evaluated continuously.

6. The method of claim 1, wherein said transitions occurred are counted by at least one counter having a counting depth of at least one, in particular having a counting depth of more than 5, preferably between 10 and 1000.

7. The method of claim 1, wherein said second sampling point is adjusted so that within said first time period a counted number of transitions in said bit stream is equal to a counted number of transitions within said second time period.

8. The method of claim 1, wherein said second sampling point is adjusted by a variable delay time of a master clock signal, said master clock signal having preferably the same frequency as said bit stream.

9. The method of claim 1, wherein said first sampling point is on or before an earliest transition of said bit stream within said first sampling sequence, and said third sampling point is on or after a latest transition of said bit stream within said first sampling sequence.

10. The method of claim 1, wherein the number of transitions between said third sampling point of said first sampling sequence and a first sampling point of a second sampling sequence following said first sampling sequence is determined.

11. The method of claim 1, wherein bits of said bit stream are extracted uniformly at said first sampling points of succeeding sampling sequences, or uniformly at said third sampling points of succeeding sampling sequences.

12. The method of claim 1, wherein bits of said bit stream are extracted uniformly at fourth sampling points of succeeding sampling sequences, said fourth sampling point is respectively between said third sampling point of said first sampling sequence and said first sampling point of a sampling sequence subsequent to said first sampling sequence.

13. The method of claim 1, wherein information about a drift spectrum is extracted from recording transition tracking.

14. The method of claim 1, wherein said signal is to be evaluated by comparison of bits extracted from said bit stream with a predetermined expected bit stream.

15. A method for testing an electronic device, wherein said method for testing comprises said method for tracking transitions of claim 1, wherein said bit stream of said signal is an output signal of said electronic device, said output signal being a response on a predetermined input signal supplied to said electronic device.

16. A software program or product, preferably stored on a data carrier, for executing the method of claim 1, when running on a data processing system such as a computer.

17. A system for tracking transitions in a bit stream of a signal, said system comprising a sampling unit for
    taking a first sample of said bit stream at a first sampling point of a first sampling sequence,
    taking a second sample of said bit stream at a second sampling point of said first sampling sequence, and
    taking a third sample of said bit stream at a third sampling point of said first sampling sequence,
    and evaluating occurrence of at least one transition within at least one of a first and a second time period, wherein the first time period is defined by said first and said second sampling points, and the second time period is defined by said second and said third sampling points, an adjusting unit for adjusting said second sampling point to be near to the point in time where transitions occurred, and circuitry for tracking transitions in the bit stream by comparing bit values of the first, second, and third samples of the bit stream.

* * * * *